(12) United States Patent
Byers et al.

(10) Patent No.: US 10,872,465 B2
(45) Date of Patent: Dec. 22, 2020

(54) SYSTEM AND METHOD FOR MODEL DRAWING TOOL

(71) Applicant: General Electric Company, Schenectady, NY (US)

(72) Inventors: Jason Anton Byers, Greenville, SC (US); Alexandria Cochrane, Greenville, SC (US); Xuefeng Zhang, Evandale, OH (US); Brian Christopher Wheeler, Greenville, SC (US); Prashant Madhukar Kulkarni, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 291 days.

(21) Appl. No.: 15/584,951

(22) Filed: May 2, 2017

(65) Prior Publication Data

US 2018/0322694 A1 Nov. 8, 2018

(51) Int. Cl.
*G06F 7/02* (2006.01)
*G06F 16/00* (2019.01)
*G06T 17/05* (2011.01)
*G06F 3/048* (2013.01)
*G06F 30/00* (2020.01)
*G06F 30/13* (2020.01)
*G06F 30/15* (2020.01)

(52) U.S. Cl.
CPC .............. *G06T 17/05* (2013.01); *G06F 3/048* (2013.01); *G06F 30/00* (2020.01); *G06F 30/13* (2020.01); *G06F 30/15* (2020.01); *G06T 2207/20108* (2013.01)

(58) Field of Classification Search
CPC ............... G06T 17/05; G06T 3/048; G06T 2207/20108; G06T 3/037; G06F 17/5004; G06F 17/05; G06F 2217/02; G06F 17/50; G06F 17/5086; G06F 2217/04; G06F 2217/06; G06F 16/258; G06F 16/252; G06F 30/17; G06F 30/12; G06F 2111/02; G06F 16/50
See application file for complete search history.

(56) References Cited

U.S. PATENT DOCUMENTS

| 7,103,434 B2 | 9/2006 | Chernyak et al. |
| 2004/0250236 A1* | 12/2004 | O'Malley ............... G06F 17/50 717/104 |
| 2007/0013709 A1 | 1/2007 | Charles et al. |
| 2008/0120070 A1* | 5/2008 | Miller ................. G06F 17/5086 703/1 |

(Continued)

*Primary Examiner* — Bruce M Moser
(74) *Attorney, Agent, or Firm* — Fletcher Yoder, P.C.

(57) ABSTRACT

A tangible, non-transitory, machine-readable medium including instructions presents a graphical user interface (GUI) and the GUI provides an indication of two or more output file types. Further, the medium including instructions receives an indication of a selection of at least two of the two or more output file types. Moreover, the medium including instructions generates corresponding output files for the selection of the at least two of the two or more output file types by accessing an applicable computer-aided-design (CAD) model associated with a part number. Also, the medium including instructions generates corresponding output files for the selection of the at least two of the two or more output file types.

15 Claims, 11 Drawing Sheets

(56) References Cited

U.S. PATENT DOCUMENTS

2009/0309875 A1* 12/2009 Okada ................. G06F 17/5081
   345/419
2010/0274818 A1  10/2010 Chauvin et al.
2012/0109590 A1   5/2012 Trainer et al.
2013/0182131 A1*  7/2013 Naono .................... G06F 16/58
   348/207.1
2016/0246899 A1*  8/2016 Hirschtick .............. G06F 17/50
2016/0259508 A1*  9/2016 Eccleston ............. G06F 3/0484

* cited by examiner

FIG. 6A

250 — Format Manager window
253 — refresh/close controls
252 — SOURCE PART / LOADED PART
254 — SETTINGS
258 — EXPORT CONTROL: NOT EXPORT CONTROLLER
256 — CLASSIFICATION: CLASS II (INTERNAL)
260 — DESCRIPTION: APP TEST PART
262 — FIRST MADE FOR: APP TESTING
264 — SIMILAR TO: PARTS APP TESTED
266 — FRENCH TITLE: LE APP ESSAI PARTIE
268 — EXCLUDE FROM BOM: NO
270 — MODEL VALIDATED: YES
272 — ☐ SET CROSSHAIRS
274 — ☑ SET PREFERENCES
276 — ☐ NOTES AT MBD02
278 — ☐ DATUM TABLE AT MBD02
280 — ☐ CHOOSE PRIMARY VIEW CSYS
282 — ☐ CHOOSE SUBSEQUENT VIEW CSYS
284 — ☑ SELECT BODIES FOR WEIGHT MEASURE (4)
286 — 2D/3D PDF ATTRIBUTES
288 — DRAWING TYPE: DETAIL
290 — CREATED BY: DRAFTER
292 — APPROVED BY: ENGINEERING
294 — CREATION DATE: 2016-03-22
296 — SHOW REVISION FIELDS (NOT A REVISION)
298 — OPTIONAL ATTRIBUTES
300 — MLI (EX. 1303, 0909): 9991
302 — FRAME (EX. 7FA, 9E): APPTEST
304 — DM (EX. GN001, F1234G1): GS7093
306 — IEC16355: NONE

TO 6B

SYSTEM AND METHOD FOR MODEL DRAWING TOOL

BACKGROUND

The subject matter disclosed herein relates to systems for design of parts, such as industrial machine parts. More particularly, the current application relates to automated formatting for a computer aided design (CAD) system. Many parts are designed using CAD systems, which allows the designer to create precise designs. The part may then be inspected for its ability to fulfill its design purpose. To aid in the inspection, drawings of the part may be created to showcase certain features or details of the part. The drawings may be changed to different file formats, or may be checked to ensure the drawing incorporates an up-to-date model. It may be beneficial to improve the design and inspection of machine parts.

BRIEF DESCRIPTION

Certain embodiments commensurate in scope with the original claims are summarized below. These embodiments are not intended to limit the scope of the claims, but rather these embodiments are intended only to provide a brief summary of possible forms of the systems and techniques described herein. Indeed, the presently disclosed embodiments may encompass a variety of forms that may be similar to or different from the embodiments set forth below.

In a first embodiment, a tangible, non-transitory, machine-readable medium including instructions presents a graphical user interface (GUI) and the GUI provides an indication of two or more output file types. Further, the medium including instructions receives an indication of a selection of at least two of the two or more output file types. Moreover, the medium including instructions generates corresponding output files for the selection of the at least two of the two or more output file types by accessing an applicable computer-aided-design (CAD) model associated with a part number. Also, the medium including instructions generates corresponding output files for the selection of the at least two of the two or more output file types by accessing one or more attributes associated with the CAD model. Further, the medium including instructions generates corresponding output files for the selection of the at least two of the two or more output file types by deriving applicable data that is applicable to the at least two of the two or more output file types from the CAD model and from the one or more attributes. The medium including instructions also generates corresponding output files for the selection of the at least two of the two or more output file types by generating an output file for each of the at least two of the two or more output file types, and the output file is formatted in accordance with a formatting specification of a corresponding output file type.

In a second embodiment, a computer system includes a processor configured to present a graphical user interface (GUI) and the GUI provides an indication of two or more output file types. Further, the processor is configured to receive an indication of a selection of at least two of the two or more output file types. Moreover, the processor is configured to generate corresponding output files for the selection of the at least two of the two or more output file types by accessing an applicable computer-aided-design (CAD) model associated with a part number. Also, the processor is configured to generate corresponding output files for the selection of the at least two of the two or more output file types by accessing one or more attributes associated with the CAD model. Further, the processor is configured to generate corresponding output files for the selection of the at least two of the two or more output file types by deriving applicable data that is applicable to the at least two of the two or more output file types from the CAD model and from the one or more attributes. The processor is also configured to generate corresponding output files for the selection of the at least two of the two or more output file types by generating an output file for each of the at least two of the two or more output file types, and the output file is formatted in accordance with a formatting specification of a corresponding output file type.

In a third embodiment, a computer-implemented method includes presenting a graphical user interface (GUI) and the GUI provides an indication of two or more output file types. Further, the method includes receiving an indication of a selection of at least two of the two or more output file types. Moreover, the method includes generating corresponding output files for the selection of the at least two of the two or more output file types by accessing an applicable computer-aided-design (CAD) model associated with a part number. Also, the method includes generating corresponding output files for the selection of the at least two of the two or more output file types by accessing one or more attributes associated with the CAD model. Further, the method includes generating corresponding output files for the selection of the at least two of the two or more output file types by deriving applicable data that is applicable to the at least two of the two or more output file types from the CAD model and from the one or more attributes. The method also includes generating corresponding output files for the selection of the at least two of the two or more output file types by generating an output file for each of the at least two of the two or more output file types, and the output file is formatted in accordance with a formatting specification of a corresponding output file type.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIGS. 6A and 6B illustrate, respectively, a first portion of an embodiment of a graphical user interface ("GUI") used to aid in generating drawings of a model and a second portion of an embodiment of a graphical user interface ("GUI") used to aid in generating drawings of a model;

DETAILED DESCRIPTION

Figure 1:
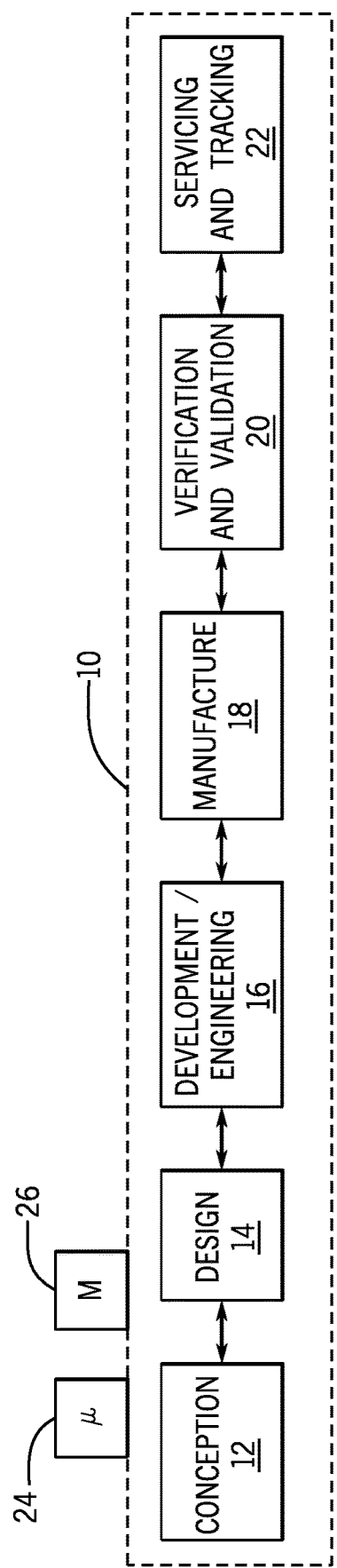
FIG. 1 is a block diagram of an embodiment of a computer-aided technology (CAx) system.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

As described in more detail below, certain systems and methods may be used to design a machine and/or machine parts. For example, the part design may be created as a model-based definition included in a 2-dimensional (2D) or 3-dimensional (3D) computer aided design (CAD) model. The techniques described herein may enhance typical engineering part drawing or drawings, as the drawings generated via the current techniques utilize manual entry of information, which may decrease the accuracy of the information and may increase the time to enter the information.

After creating the part design, a format manager system may be executed using the part design (e.g., the CAD model) as the input. The format manager system may generate drawings of the part design that automatically conform to certain drawing standards. For example, certain organizations create standards for model drawings. The standards allow all drawings created within the organization to be homogenous. This makes it easier for anyone viewing the drawing to quickly receive the pertinent information (e.g., specific subsets of information in expected positions, with expected formatting (e.g., font type, font size, justification, alignment, color, etc.)). As such, the format manager generates drawings that automatically adhere to preset standards, resulting in increased drafting time efficiencies and increased accuracy and precision in model drawings.

With the foregoing in mind, it may be useful to describe a computer-aided technologies (CAx) system that may incorporate the techniques described herein, for example to improve product lifecycle management (PLM) processes. Accordingly, FIG. 1 illustrates an embodiment of a CAx system 10 suitable for providing for a variety of processes, including PLM processes 12, 14, 16, 18, 20, 22. In the depicted embodiment, the CAx system 10 may include support for execution of conception processes 12. For example, the conception processes 12 may produce a set of specifications such as requirements specifications documenting a set of requirements to be satisfied by a design, a part, a product, or a combination thereof. The conception processes 12 may also produce a concept or prototype for the part or product (e.g., machine). A series of design processes 14 may then use the specifications and/or prototype to produce, for example, one or more 3D design models of the part or product. The 3D design models may include solid/surface modeling, parametric models, wireframe models, vector models, non-uniform rational basis spline (NURBS) models, geometric models, and the like.

Design models may then be further refined and added to via the execution of development/engineering processes 16. The development/engineering processes may, for example, create and apply models such as thermodynamic models, low cycle fatigue (LCF) life prediction models, multibody dynamics (MBD) and kinematics models, computational fluid dynamics (CFD) models, finite element analysis (FEA) models, and/or 3-dimension to 2-dimension FEA mapping models that may be used to predict the behavior of the part or product during its operation. For example, turbine blades may be modeled to predict fluid flows, pressures, clearances, and the like, during operations of a gas turbine engine. The development/engineering processes 16 may additionally result in tolerances, materials specifications (e.g., material type, material hardness), clearance specifications, and the like.

The CAx system 10 may additionally provide for manufacturing processes 18 that may include manufacturing automation support. For example, additive manufacturing models may be derived, such as 3D printing models for material jetting, binder jetting, vat photopolymerization, powder bed fusion, sheet lamination, directed energy deposition, material extrusion, and the like, to create the part or product. Other manufacturing models may be derived, such as computer numeric control (CNC) models with G-code to machine or otherwise remove material to produce the part or product (e.g., via milling, lathing, plasma cutting, wire cutting, and so on). Bill of materials (BOM) creation, requisition orders, purchasing orders, and the like, may also be provided as part of the manufacture processes 18 (or other PLM processes).

A servicing and tracking set of processes 22 may also be provided via the CAx system 10. The servicing and tracking processes 22 may log maintenance activities for the part, part replacements, part life (e.g., in fired hours), and so on. As illustrated, the CAx system 10 may include feedback between the processes 12, 14, 16, 18, 20, 22. For example, data from services and tracking processes 22, for example, may be used to redesign the part or product via the design processes 14. Indeed, data from any one of the processes 12, 14, 16, 18, 20, 22 may be used by any other of the processes 12, 14, 16, 18, 20, 22 to improve the part or product or to create a new part or a new product. In this manner, the CAx system 10 may incorporate data from downstream processes and use the data to improve the part or to create a new part.

The CAx system 10 may additionally include one or more processors 24 and a memory system 26 that may execute software programs to perform the disclosed techniques. Moreover, the processors 24 may include multiple microprocessors, one or more "general-purpose" microprocessors, one or more special-purpose microprocessors, and/or one or more application specific integrated circuits (ASICS), or some combination thereof. For example, the processors 24 may include one or more reduced instruction set (RISC) processors. The memory system 26 may store information such as control software, look up tables, configuration data, etc. The memory system 26 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

Figure 2:
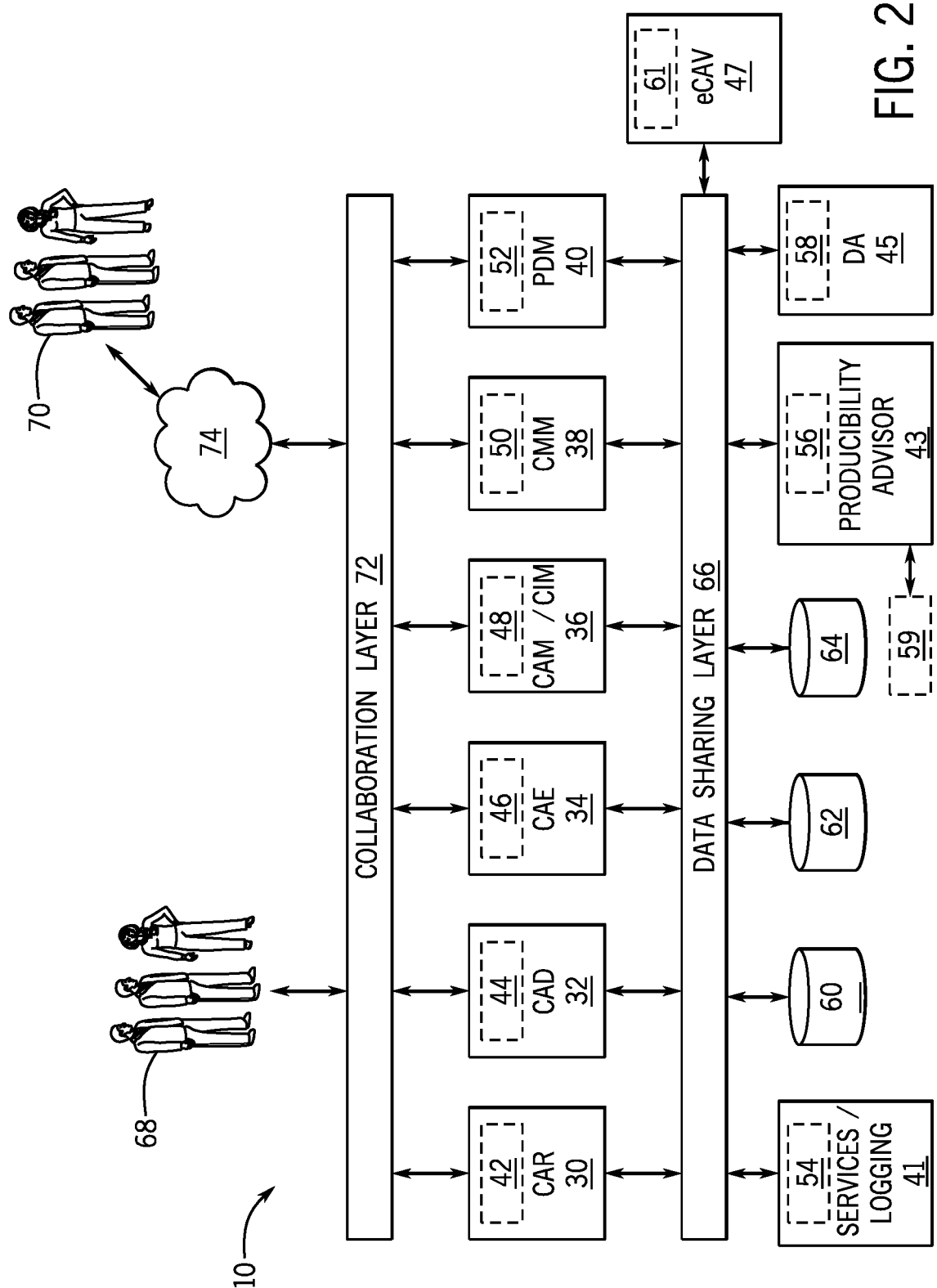
FIG. 2 is a block diagram of embodiments of certain components of the CAx system of FIG. 1.

The memory system 26 may store a variety of information, which may be suitable for various purposes. For example, the memory system 26 may store machine-readable and/or processor-executable instructions (e.g., firmware or software) for the processors' 24 execution. In one embodiment, the executable instructions include instructions for a number of PLM systems, for example software systems, as shown in the embodiment of FIG. 2. More specifically, the CAx system 10 embodiment illustrates a computer-aided requirements capture (CAR) system 30, a computer-aided design (CAD) system 32, a computer-aided engineering (CAE) system 34, computer-aided manufacturing/computer-integrated manufacturing (CAM/CIM) system 36, a coordinate-measuring machine (CMM) system 38, and a product data management (PDM) system 40. Each of the systems 30, 32, 34, 36, 38 and 40 may be extensible and/or customizable, accordingly, each system 30 may include an extensibility and customization system 42, 44, 46, 48, 50, and 52, respectively. Additionally, each of the systems 30, 32, 34, 36, 38 and 40 may be stored in a memory system, such as memory system 26, and may be executable via a processor, such as via processors 24.

In the depicted embodiment, the CAR system 30 may provide for entry of requirements and/or specifications, such as dimensions for the part or product, operational conditions that the part or product is expected to encounter (e.g., temperatures, pressures), certifications to be adhered to, quality control requirements, performance requirements, and so on. The CAD system 32 may provide for a graphical user interface suitable to create and manipulate graphical representations of 2D and/or 3D models as described above with respect to the design processes 14. For example, the 3D design models may include solid/surface modeling, parametric models, wireframe models, vector models, non-uniform rational basis spline (NURBS) models, geometric models, and the like. The CAD system 32 may provide for the creation and update of the 2D and/or 3D models and related information (e.g., views, drawings, annotations, notes, and so on). Indeed, the CAD system 32 may combine a graphical representation of the part or product with other, related information.

The CAE system 34 may enable creation of various engineering models, such as the models described above with respect to the development/engineering processes 16. For example, the CAE system 34 may apply engineering principles to create models such as thermodynamic models, low cycle fatigue (LCF) life prediction models, multibody dynamics (MBD) and kinematics models, computational fluid dynamics (CFD) models, finite element analysis (FEA) models, and/or 3-dimension to 2-dimension FEA mapping models. The CAE system 34 may then apply the aforementioned models to analyze certain part or product properties (e.g., physical properties, thermodynamic properties, fluid flow properties, and so on), for example, to better match the requirements and specifications for the part or product.

The CAM/CIM system 36 may provide for certain automation and manufacturing efficiencies, for example, by deriving certain programs or code (e.g., G-code) and then executing the programs or code to manufacture the part or product. The CAM/CIM system 36 may support certain automated manufacturing techniques, such as additive (or subtractive) manufacturing techniques, including material jetting, binder jetting, vat photopolymerization, powder bed fusion, sheet lamination, directed energy deposition, material extrusion, milling, lathing, plasma cutting, wire cutting, or a combination thereof. The CMM system 38 may include machinery to automate inspections. For example, probe-based, camera-based, and/or sensor-based machinery may automatically inspect the part or product to ensure compliance with certain design geometries, tolerances, shapes, and so on.

The PDM system 40 may be responsible for the management and publication of data from the systems 30, 32, 34, 36, and/or 38. For example, the systems 30, 32, 34, 36, and/or 38 may communicate with data repositories 56, 58, 60 via a data sharing layer 62. The PDM system 40 may then manage collaboration between the systems 30, 32, 34, 36, and/or 38 by providing for data translation services, versioning support, archive management, notices of updates, and so on. The PDM system 40 may additionally provide for business support such as interfacing with supplier/vendor systems and/or logistics systems for purchasing, invoicing, order tracking, and so on. The PDM system 40 may also interface with service/logging systems (e.g., service center data management systems) to aid in tracking the maintenance and life cycle of the part or product as it undergoes operations. Teams 64, 66 may collaborate with team members via a collaboration layer 68. The collaboration layer may include web interfaces, messaging systems, file drop/pickup systems, and the like, suitable for sharing information and a variety of data. The collaboration layer 68 may also include cloud-based systems 70 or communicate with the cloud-based systems 70 that may provide for decentralized computing services and file storage. For example, portions (or all) of the systems 30, 32, 34, 36, 38 may be stored in the cloud 70 and/or accessible via the cloud 70.

The producibility advisor system may include or have access to a user-configurable set of design producibility rules to aid in evaluating the producibility of a part or product design. That is, the producibility advisor system may provide for automated guidance focused on the design's compliance with manufacturing techniques, on improving the creation of the part or product, on improving the part or product's ability to operate as specified in its design, on improving the part or product's quality, on improving the engineering of the part or product, improving manufacturing (e.g., manufacturing efficiency, use of materials, manufacturing time) and/or on lowering manufacturing cost for the part or product. In one embodiment, the producibility advisor system may execute the producibility rules to derive one or more producibility reports, metrics, and the like, detailing or otherwise assessing the part or product's design and product and manufacturing information (PMI) compliance with manufacturing techniques, such as additive and/or subtractive manufacturing. Likewise, the producibility reports and metrics may detail or aid in detailing changes in design, in geometries, in tolerances, in machine settings, in machine calibrations, and so on, useful to improve the part or product and/or the manufacturing processes. Accordingly, the design may be updated based on the producibility advisor system metrics, reports, and the like.

The extensibility and customization systems 42, 44, 46, 48, 50, and 52 may provide for functionality not found natively in the CAR system 30, the CAD system 32, the CAM/CIM system 36, the CMM system 38 and/or the PDM system 40. For example, computer code or instructions may be added to the systems 30, 32, 34, 36, and/or 38 via shared libraries, modules, software subsystems and the like, included in the extensibility and customization systems 42, 44, 46, 48, 50, and/or 52. The extensibility and customization systems 42, 44, 46, 48, 50, and 52 may also use application programming interfaces (APIs) included in their respective systems 30, 32, 34, 36, and 38 to execute certain functions, objects, shared data, software systems, and so on, useful in extending the capabilities of the CAR system 30, the CAD system 32, the CAM/CIM system 36, the CMM system 38 and/or the PDM system 40. By enabling the processes 12, 14, 16, 18, 20, and 22, for example, via the systems 30, 32, 34, 36, and 38 and their respective extensibility and customization systems 42, 44, 46, 48, 50, and 52, the techniques described herein may provide for a more efficient "cradle-to-grave" product lifecycle management.

Figure 3:
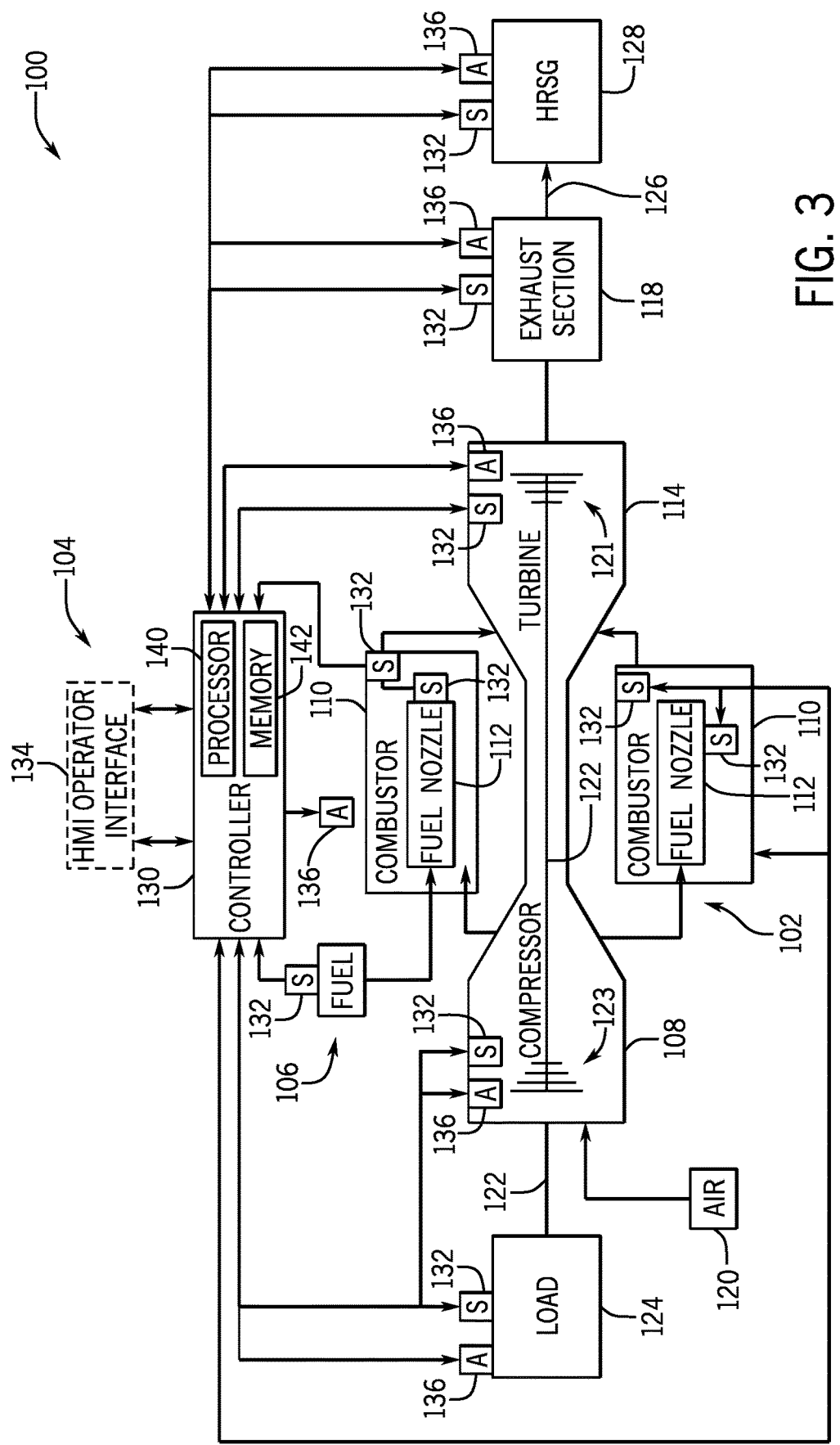
FIG. 3 is block diagram of an embodiment, of an industrial system that may be conceived, designed, engineered, manufactured, and/or service and tracked by the CAx system of FIG. 1.

It may be beneficial to describe a machine that would incorporate one or more parts manufactured and tracked by the processes 12, 14, 16, 18, 20, and 22, for example, via the CAx system 10. Accordingly, FIG. 3 illustrates an example of a power production system 100 that may be entirely (or partially) conceived, designed, engineered, manufactured, serviced, and tracked by the CAx system 10. As illustrated in FIG. 1, the power production system 100 includes a gas turbine system 102, a monitoring and control system 104, and a fuel supply system 106. The gas turbine system 102 may include a compressor 108, combustion systems 110, fuel nozzles 112, a gas turbine 114, and an exhaust section 118. During operation, the gas turbine system 102 may pull air 120 into the compressor 108, which may then compress the air 120 and move the air 120 to the combustion system 110 (e.g., which may include a number of combustors). In the combustion system 110, the fuel nozzle 112 (or a number of fuel nozzles 112) may inject fuel that mixes with the compressed air 120 to create, for example, an air-fuel mixture.

The air-fuel mixture may combust in the combustion system 110 to generate hot combustion gases, which flow downstream into the turbine 114 to drive one or more turbine stages. For example, the combustion gases may move through the turbine 114 to drive one or more stages of turbine blades 144, which may in turn drive rotation of a shaft 122. The shaft 122 may connect to a load 124, such as a generator that uses the torque of the shaft 122 to produce electricity. After passing through the turbine 114, the hot combustion gases may vent as exhaust gases 126 into the environment by way of the exhaust section 118. The exhaust gas 126 may include gases such as carbon dioxide ($CO_2$), carbon monoxide (CO), nitrogen oxides ($NO_x$), and so forth.

The exhaust gas 126 may include thermal energy, and the thermal energy may be recovered by a heat recovery steam generation (HRSG) system 128. In combined cycle systems, such as the power plant 100, hot exhaust 126 may flow from the gas turbine 114 and pass to the HRSG 128, where it may be used to generate high-pressure, high-temperature steam. The steam produced by the HRSG 128 may then be passed through a steam turbine engine for further power generation. In addition, the produced steam may also be supplied to any other processes where steam may be used, such as to a gasifier used to combust the fuel to produce the untreated syngas. The gas turbine engine generation cycle is often referred to as the "topping cycle," whereas the steam turbine engine generation cycle is often referred to as the "bottoming cycle." Combining these two cycles may lead to greater efficiencies in both cycles. In particular, exhaust heat from the topping cycle may be captured and used to generate steam for use in the bottoming cycle.

In certain embodiments, the system 100 may also include a controller 130. The controller 130 may be communicatively coupled to a number of sensors 132, a human machine interface (HMI) operator interface 134, and one or more actuators 136 suitable for controlling components of the system 100. The actuators 136 may include valves, switches, positioners, pumps, and the like, suitable for controlling the various components of the system 100. The controller 130 may receive data from the sensors 132, and may be used to control the compressor 108, the combustors 110, the turbine 114, the exhaust section 118, the load 124, the HRSG 128, and so forth.

In certain embodiments, the HMI operator interface 134 may be executable by one or more computer systems of the system 100. A plant operator may interface with the industrial system 10 via the HMI operator interface 44. Accordingly, the HMI operator interface 134 may include various input and output devices (e.g., mouse, keyboard, monitor, touch screen, or other suitable input and/or output device) such that the plant operator may provide commands (e.g., control and/or operational commands) to the controller 130.

The controller 130 may include a processor(s) 140 (e.g., a microprocessor(s)) that may execute software programs to perform the disclosed techniques. Moreover, the processor 140 may include multiple microprocessors, one or more "general-purpose" microprocessors, one or more special-purpose microprocessors, and/or one or more application specific integrated circuits (ASICS), or some combination thereof. For example, the processor 39 may include one or more reduced instruction set (RISC) processors. The controller 130 may include a memory device 142 that may store information such as control software, look up tables, configuration data, etc. The memory device 142 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

Figure 4:
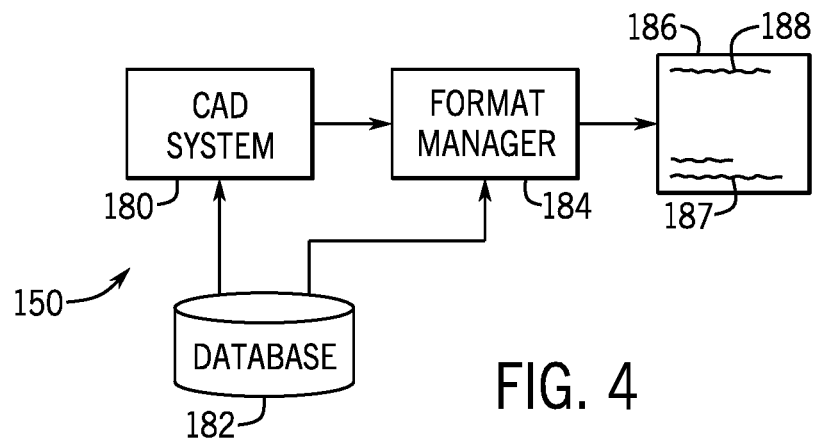
FIG. 4 is a block diagram of an embodiment of a system that may generate drawings of a model using format manager logic.

After a model has been designed, the model may be presented for various purposes (e.g., approval, manufacturing, sale, etc.). A drawing of the model may be generated to aid in the presentation of the model. FIG. 4 is a block diagram of an embodiment of a system 150 that may generate drawings of a model using format manager logic. The system 150 allows a user to generate drawings of a model that automatically include sets of desired information presented in a desired format. Included in the system 150 is a CAD system 180 (e.g., the same one as the CAD system 32), a database 182 (e.g., a datastore), and a format manager 184 that generates formatted drawings 186 that include the sets of desired information presented in the desired format.

As discussed above, the CAD system 180 may provide 2D or 3D graphical representations of parts and may allow a user to manipulate the graphical representations to create models, drawings, reports, etc. As will be discussed in more detail below, models and/or drawings generated in the CAD system 180 may be the basis for formatted drawings generated by the format manager 184.

The database 182 may store information that is accessible to either the CAD system 180, the format manager 184, or both. The database 182 may be stored locally or located separately from the CAD system 180 and the format manager 184, and may be accessible to multiple CAD systems 180 and format managers 184. In one embodiment, the database 182 may store a set of formatting rules used by the format manager 184 that are used to determine pre-defined formatting that the format manager 184 should use when generating the formatted drawings.

The format manager 184 is a program that may be executable within the CAD system 180, executable separate from the CAD system 180, or a combination thereof. As mentioned above, the format manager 184 enables users to generate drawings that automatically contain information and formatting desired by the user. For example, it may be desirable to present a title in a certain location and include a particular font and size. The user may include this information within the format manager 184 so that when a user executes the format manager 184, a formatted drawing 186 is generated, where the formatted drawing 186 includes desired information 187 and formatting (e.g., as defined by data in the database 182). For example, a title 188 may be presented in the correct location (e.g., top-centered) and with the correct font and size. Automated information insertion and/or formatting results in more uniform drawings with less manual user entry, resulting in time efficiency and a lower rate of error.

Figure 5:
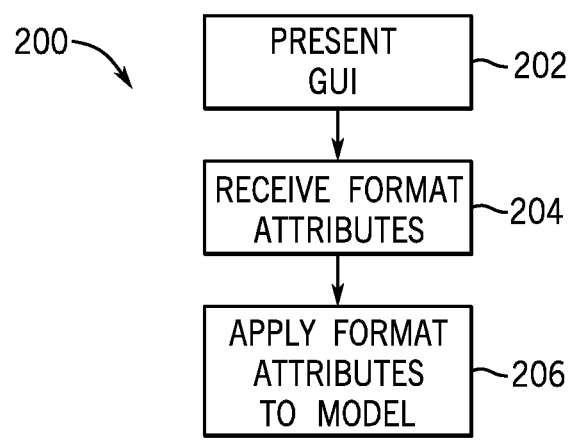
FIG. 5 is a flow chart illustrating an embodiment of a process to aid in creating drawings of a model using format manager logic.

FIG. 5 is a flow chart illustrating an embodiment of a process 200 to aid in creation of drawings for a model. Although the following process 200 describes a number of operations that may be performed, it should be noted that the process 200 may be performed in a variety of suitable manners, using some or all of the operations of the process 200.

Figure 6B:
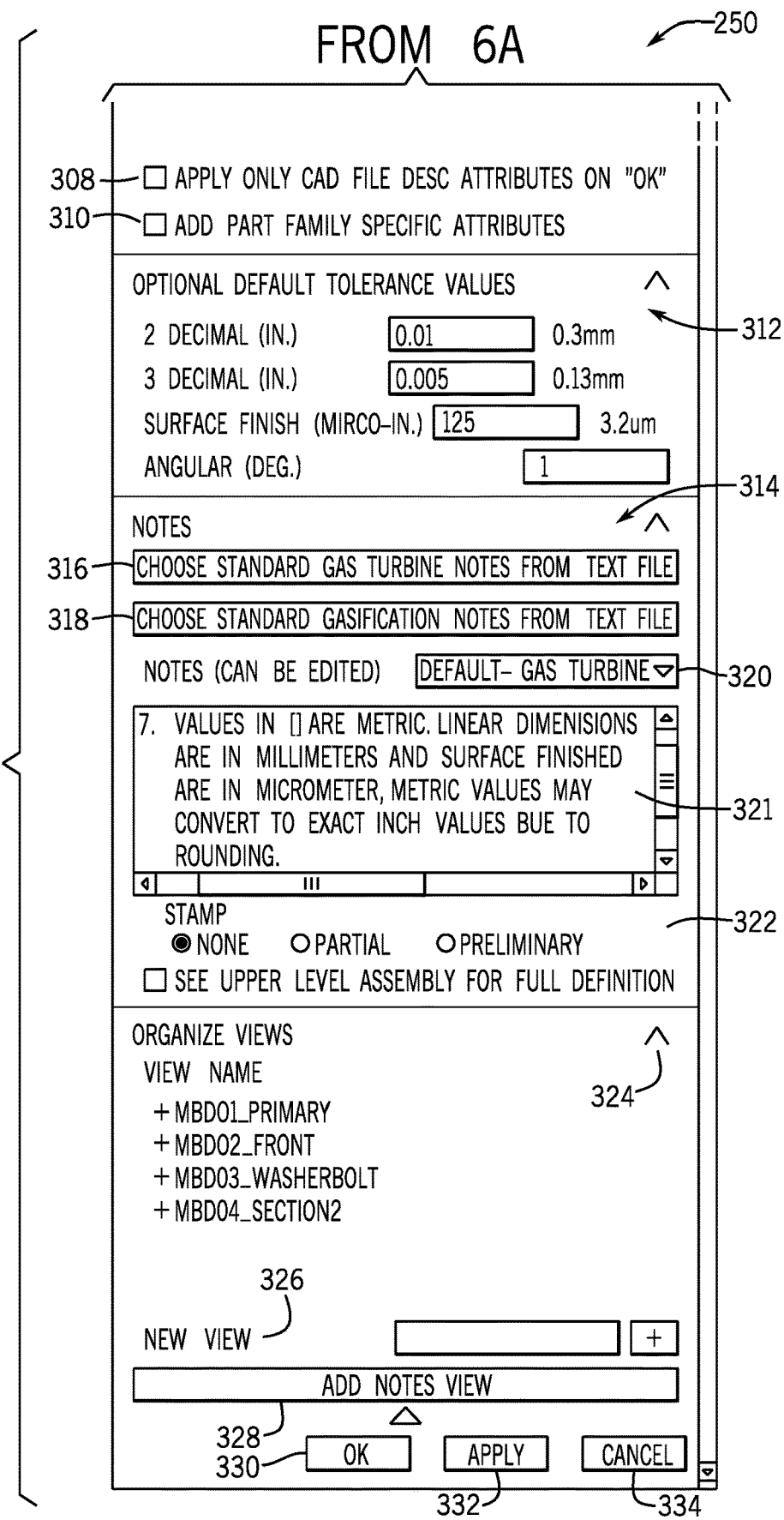

An indication to execute the format manager 184 may be received. For example, a user may navigate through a menu interface and select an option entitled "Format Manager." Upon receiving this indication, the format manager 184 may execute. After executing, the format manager 184 presents (block 202) a graphical user interface ("GUI"). An example of such a GUI is illustrated in FIGS. 6A and 6B. The GUI is useful for collecting format attributes, by receiving an indication of the attributes.

The format attributes collected by the GUI may be useful for applying dynamic attributes to the formatted drawing 186. Other attributes, for example, static attributes, may be stored in the database 182, or elsewhere. The static attributes may also be applied to the formatted drawing 186.

Then, the format manager 184 receives (block 204) the format attributes. The format attributes may be entered into the GUI by a user or the format attributes may be created separately and stored in the database 182 by, for example, importing a text file or other data via the GUI. In one embodiment, the format manager 184 may access the database 182 and read the format attributes from the database 182. The format attributes may include attributes relevant to creating a drawing of a model. For example, the format attributes may include an overall size of the drawing, where the title is located, a font size, type, and style for particular text of the drawing, dimensions for areas that are sectioned off for particular purposes, etc. Information that can be included and formatted for the drawing may include all aspects of a drawing, including the drawing type, the creator, the approver, the creation date, the values for dimensions, tolerances, weights, material compositions, etc.

Next, the format manager 184 applies (block 206) the format attributes to the model. In doing so, the format manager 184 creates drawings of the model according to the format attributes. For example, the format manager 184 may present a formatted drawing 186 having sections dimensioned based upon the attributes. Further, the sections may be populated with information that is defined by the attributes. This information may be formatted as defined by the attributes. Further, it should be appreciated that the format manager 184 may simultaneously present multiple drawings, and each drawing may include different views or format attributes.

Figure 7:
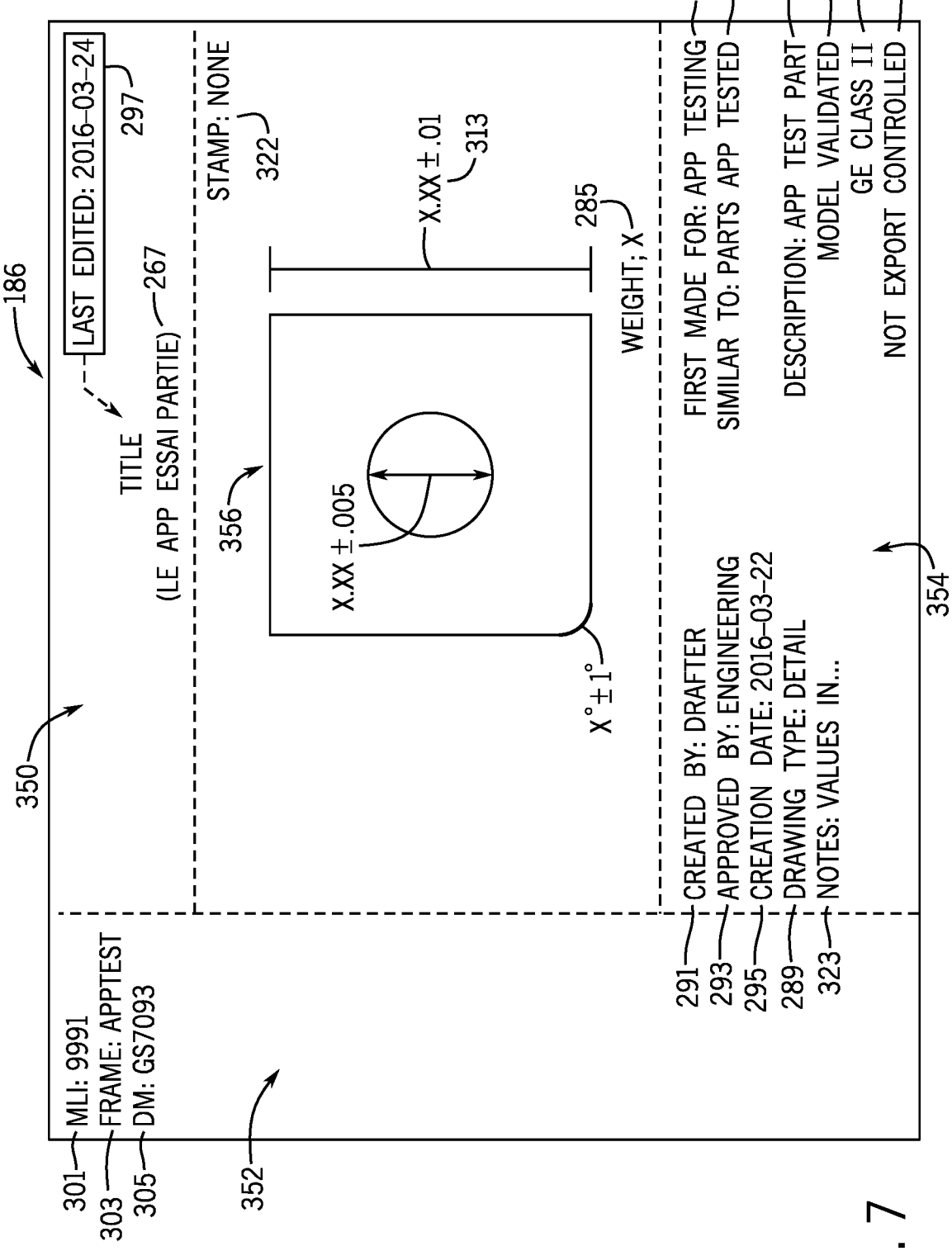
FIG. 7 is an embodiment of a generated drawing that includes attributes received from the GUI of FIG. 6.

FIGS. 6A and 6B are embodiments of separate portions of a GUI 250 presented to the user, enabling definition of the formatting attributes and/or content to be inserted during generation of a formatted drawing 186. FIG. 7 is an illustration of an example formatted drawing 186 that may be formatted using the format manager 184. For clarity, these figures will be discussed together. It should be appreciated that the embodiments of FIGS. 6 and 7 are intended to facilitate a discussion of attributes and automatic insertion and/or formatting of content. Accordingly, alternative attributes and/or content may be provided via the GUIs and/or drawings. The current discussion is not intended to limit the attributes to those offered in FIGS. 6 and 7 or limit the content insertion and/or formatting to that discussed in FIGS. 6 and 7.

The GUI 250 may include various sections (e.g., a Source Part Section 252, a Settings Section 254, etc.) enabling categorization and/or compartmentalization of formatting attributes and/or content. One or more of the sections may include an arrow 253, which allows a user to hide or display the section in which the arrow 252 is displayed. This allows the user to make the GUI 250 more compact if the user desires.

The generated formatted drawing 186 may be auto-populated with information and/or auto-formatted from the GUI 250. For example, formatting attributes may segment the formatted drawing 186 into sections (e.g., a top section 350, a side section 352, and/or a bottom section 354). Content and/or formatting may be inserted and/or applied to particular portions of the formatted drawing 186, as will be discussed in detail below.

It may be beneficial to provide an input for indicating a particular part (e.g., a CAD model assembly) that will be the basis for the generated formatted drawing. Accordingly, in some embodiments, the GUI 250 includes a source part section 252, which allows a user to select a part. The source part section 252 displays which part the format attributes will be applied to. If a part is already selected when a user selects the format manager 184, the selected part may be preloaded into the drop down box next to the text "Loaded Part." If a part is not already selected, a user may use the drop down box to select the desired part. Accordingly, as illustrated in FIG. 7, a part 356 is provided in the formatted drawing 186, based upon selection of a source part in the source part section 252.

It may be desirable to specify certain settings for the part indicated in the source part section 252. Accordingly, the GUI 250 may include a settings section 254. In the current embodiment, the settings section 254 includes various options for the user to input selections. The user may, in some embodiments, select certain classifications for the drawings (e.g., government or company classification designations). In the illustrated embodiment, the first option is an "Export Control" option 256. The export control option 256 includes a drop down box, where a user can select either "NOT Export Controlled" or "Export Controlled." Some countries have laws that include restrictions on the export of certain parts and/or information related to the parts (e.g., drawings). By setting a part to "Export Controlled" a user is communicating that the part and/or drawing may be subject to such export restrictions.

In some embodiments, the "Export Control" option 256 selections 257 will be displayed on the formatted drawing 186, as illustrated in FIG. 7. This information is useful to display on the drawing itself because whether a drawing is export controlled or not dictates certain protocols and/or actions that can or must be taken with regard to the part and/or drawing.

The next option listed in the settings section 254 of the current embodiment is a "Classification" option 258. The classification option 258 includes a drop down box, which enables a user to select a classification level. The drop down box may be customized to include any available classification designation (e.g., which may be listed in the database 182).

In some embodiments, the "Classification" option 258 selections 259 will be displayed on the formatted drawing 186, as illustrated in FIG. 7. The classification designation allows a user to quickly understand what protocols can and/or must be taken in dealing with the generated drawing. For example, one classification may be "Internal Only," while another may be "Internal-External." These classifications may indicate whether a part and/or drawing of a part may be presented outside an organization.

In the current embodiment, the settings section 254 includes "Description" option 260. The "Description" option 260 includes a text box in which a user may enter any description of the drawing. In some embodiments, the "Description" option 260 input 261 be presented in the formatted drawing 186.

The settings section 254 includes options: "First Made For" option 262, "Similar To" option 264, and an alternative language title (e.g., "French Title" option 266), which enable a user to enter additional details about the part and/or drawing. It should be appreciated that the labels used in each for each option are merely representative. The "First Made For" option 262, the "Similar To" option 264, and the "French Title" option 266 settings each includes a text box in which a user may enter any text input. For example, a user may enter information about what application the part was first made for in the "First Made For" option 262. In the "Similar To" option 264, a user may enter information indicating applications or parts that are similar to the part depicted in the drawing. Further, the "French Title" option 266 may be used to enter the French translation of the title. In alternative embodiments, the "French Title" option 266 may be labelled differently to indicate to a user that any alternative language title may be entered (e.g., German, Spanish, Polish, etc.). Each of the settings, the "First Made For" option 262 selection 263, the "Similar To" option 264 selection 265, and the "French Title" option 266 selection 267, are displayed in the formatted drawing 186, as illustrated in FIG. 7.

The settings section 254 includes an option labelled "Exclude From BOM" ("bill of materials") option 268. The "Exclude From BOM" option 268 includes a drop down box where a user may select either "YES" or "NO." This choice either includes or excludes the selected part in the BOM and displays the selection on the drawing generated.

The settings section 254 also includes an option labelled "Model Validated" 270 that includes a drop down box where a user may select either "YES" or "NO." In some instances, a model may need to be validated before some further action is taken. Selecting 'YES' for indicates that the model may be used for creating or updating machining operations based on the model and that the model has been validated to be used in conjunction or in place of the drawing. The "Model Validated" 270 selection 271 will be displayed on the formatted drawing 186, as illustrated in FIG. 7.

The settings section 254 includes checkbox options for "Set Crosshairs" 272, "Set Preferences" 274, "Notes at MBD02" 276, "Datum Table at MBD02" 278, "Choose Primary View CSYS" 280, and "Choose Subsequent View CSYS" 282. In this instance, MBD02 in the above listed options represents the name of the loaded part 252, and CSYS stands for coordinate system. Selecting "Notes at MBD02" 276 may update the "Datum Table at MBD02" 278 option to "Datum Table MBD03." Selecting either the "Notes at MBD02" 276 or "Datum Table at MBD02" 278 may cause the format manager 184 to include a notes section or a datum table section in the formatted drawing 186. Selecting "Set Preferences" 274 may cause the format manager 184 to iterate through the format attributes in the drawing or model and change the format attributes to adhere to the current standards. Selecting the checkbox options "Choose Primary View CSYS" 280, and "Choose Subsequent View CSYS" 282 allows a user to create multiple formatted drawings 186 that each include one of the coordinate system views. The settings section 254 also includes a button labelled "Select Bodies for Weight Measure (4)" 284. The button 284 allows the user to select one or more parts that will be included in the weight displayed on the drawing. In the present embodiment, the user has selected four parts, thus the button 284 displays a "(4)" in the label.

In some embodiments, the "Select Bodies for Weight Measure (4)" 284 selections 285 will be displayed on the formatted drawing 186, as illustrated in FIG. 7. It should be understood that "x" is intended to be a placeholder for a value. This information is useful to display on the drawing itself because the weight of a part may be relevant to whether or not a part may be used in a certain application.

The GUI 250 includes a 2D/3D PDF Attributes section 286, which includes various options to display basic information about the drawing itself. For example, the 2D/3D PDF Attributes section 286 includes an option labelled "Drawing Type" 288 that includes a drop down box, where a user can select which type of drawing the generated drawing will be. The selection made under "Drawing Type" 288 indicates the particular type of formatted drawing 186. For example, the options under "Drawing Type" 288 may include multiple types of drawings (e.g., detail, arrangement, assembly, ordering, specification, layout, electrical diagram, installation, schematic, or data sheets). In some embodiments, the "Drawing Type" 288 selection 289 may be displayed in the formatted drawing 186, as shown in FIG. 7.

The 2D/3D PDF Attributes section 286 also includes a "Created By" option 290 that includes a text box that may receive text indicating who the drafter is. In some embodiments, the "Created By" option 290 input 291 may be displayed in the formatted drawing 186, as shown in FIG. 7. This information is useful to display on the drawing itself because the identity of the drafter may be relevant for various purposes (e.g., editing, questions, performance review, etc.).

Further, the 2D/3D PDF Attributes section 286 also includes a "Approved By" option 292 that includes a text box that may receive text indicating who approved the drawing. In some embodiments, the "Approved By" option 292 input 293 may be displayed in the formatted drawing 186, as shown in FIG. 7. This information is useful to display on the drawing itself because the identity of the approver may be relevant for various purposes (e.g., editing, questions, performance review, etc.).

The 2D/3D PDF Attributes section 286 also includes a "Creation Date" option 294 that includes text box that may receive text indicating the date on which the drawing was created. The "Creation Date" option 294 also includes a box with an arrow that may display a calendar that may allow a specific date to be chosen and the date input in a chosen format, for example year-month-date. In some embodiments, the "Creation Date" option 294 input 295 c the age of the drawing may be relevant for various purposes (e.g., whether a newer drawing should be used, whether the drawing may be compatible with other parts, etc.).

The 2D/3D PDF Attributes section 286 also includes a selectable button 296 labelled "Show Revision Fields (not a revision)." The selectable button 296 enables or disables a feature that displays which attributes have been revised after the generation of the formatted drawing 186. As such, if some information is later changed, a textual notification will be displayed next to the revised field to alert the user that the information has been revised. For example, a text box 297 in FIG. 7 indicates that the Title was edited on 2016 Mar. 24. This information is useful to display on the drawing itself because it shows what was edited and when the edit occurred.

The GUI 250 includes an Optional Attributes section 298. The options, "MLI" ("model list item") 300, "Frame" 302, "DM" 304, and "IEC16355" 306, are attribute designations that may aid a user in identifying the context in which the part may be used. For example the "MLI" 300 identifies, at a high level, what type of system the part is to be utilized in. In some embodiments, the "MLI" 300 selection 301 may be displayed in the formatted drawing 186, as shown in FIG. 7.

The "Frame" 302 identifies which larger component the part is intended to be used with. For example, the "MLI" 300 selection 301 may include multiple "Frame" 302 selections 303. In some embodiments, the "Frame" 302 selection 303 may be displayed in the formatted drawing 186, as shown in FIG. 7.

The "DM" 304 may identify an even lower level of component than the "Frame" 302 that part is intended to be used with. For example, the "Frame" 302 selection 303 may include multiple "DM" selections 305. In some embodiments, the "DM" 304 selection 305 may be displayed in the formatted drawing 186, as shown in FIG. 7.

The "IEC16355" 306 identifies a compliance standard, and alternative embodiments may include a different label, referring to a different compliance standard. In the present embodiment, the "NONE" is displayed in the text box for "IEC16355" 306. This may indicate that no testing has been completed under the relevant compliance standard. Other information may be input in this text box to indicate some amount of testing has been completed or some level of compliance has been reached.

The Optional Attributes section 298 may be modified to include other attributes that are specific to the company using the format manager 184. The Optional Attributes section 298 includes check boxes 308 and 310. The check box 308 allows a user to selectively apply only CAD file description attributes upon pressing an "OK" button 330. The check box 310 allows a user to selectively include part family specific attributes in the generated drawing.

The GUI 250 includes an Optional Default Tolerance Values section 312. Generated drawings include measurements and tolerance values associated with the measurements. The Optional Default Tolerance Values section 312 allows customization of the tolerance values for the measurements included in the generated drawing. This saves time because tolerance value may do not have to be entered for each measurement. Rather, the tolerance values that are not the same as the default values entered in the Optional Default Tolerance Values section 312 may need to be entered. The Optional Default Tolerance Values section 312 allows input of default values for measurements of surface finishes, angles, and measurements that include two or three decimal places. Selections 313 made in the Optional Default Tolerance Values section 312 may be displayed in the formatted drawing 186, as shown in FIG. 7. The Selections 313 created for both metric and imperial units. Further, the Selections 313 are used downstream to apply the tolerances throughout the drawing or model for manufacturing operations or the tolerances may be included in a section (e.g., a top section 350, a side section 352, and/or a bottom section 354) of the formatted drawing 186.

The GUI 250 includes a Notes section 314 to make it more convenient to include notes in the formatted drawing 186. The Notes section 314 includes buttons 316 and 318. The buttons 316 and 318 allow a text file to be chosen that can be designated, for example, as either the standard gas turbine notes or standard gasification notes, respectively. If a user chooses text file(s) using the buttons 316 and 318, the user may utilize the drop down box 320. The drop down box 320 displays options that refer to the labels in the buttons 316 and 318. By selecting one of the options in the drop down box 320, the user is opting to use the text from the chosen text files. The text from the chosen text file is then displayed in the text box 321. This allows the text to be edited within the format manager 184. The user may also select neither of the text files in the drop down box. Instead, notes may be entered directly into the text box 321. In some embodiments, the text box 321 input 323 may be displayed in the formatted drawing 186, as shown in FIG. 7.

The Notes section 314 also includes an option labelled "Stamp" 322. The "Stamp" 322 option allows a user to include, in the formatted drawing 186, a "Partial," "Preliminary," or "None" status designation. Other embodiments may make available other status designations. In some embodiments, the "Stamp" 322 selection 325 may be displayed in the formatted drawing 186, as shown in FIG. 7.

The GUI 250 includes an Organize Views section 324. The Organize Views section 324 includes a list of the view names of each drawing. Each part includes a + symbol which selectively displays all of the views associated with each part. The Organize Views section 324 also includes an option labelled "New View" 326 that includes a + symbol. The symbol allows a new view of a part to be added. The section 324 includes a button 328 labelled "Add Notes View." The button 328 allows a view that includes the details from the Notes section 314 to be added.

Located at the bottom of the GUI 250 are an "OK" button 330, an "Apply" button 332, and a "Cancel" button 334. Selecting the "OK" button 330 applies all of the format attributes to the model and closes the GUI 250. In applying the format attributes to the model, the format manager 184 automatically generates drawings according to the format attributes. Selecting the "Apply" button 332 applies all of the format attributes to the model, but leaves the GUI 250 open. This allows a user to continue using the GUI 250. Selecting the "Cancel" button 334 discards all of the changes made by the user in the GUI 250 and closes the GUI 250. This allows a user to easily close the format manager 184 without making any changes to the model.

Further, when the format attributes from the format manager 184 are applied, it should be appreciated than any suitable number of formatted drawings 186 may be generated (e.g., 1, 2, 3, 4, 5, 6, or more). Multiple formatted drawings 186 may be generated to highlight certain attributes, show different views of a part, show different variations of a part, etc.

In some embodiments, the format manager 184 collects the format attributes, but does not generate a formatted drawing 186. For example, for a two-dimensional (2D) drawing, the format manager 184 may collect the format attributes and create a set of boundaries (e.g., a top section 350, a side section 352, and/or a bottom section 354) where a user may enter the format attributes. Further, for a three-dimensional (3D) drawing, the format manager 184 may collect the format attributes and create various views (e.g., a general model info view, a primary view, a notes view, a datum table view, a front view) that include some or all of the format attributes.

By utilizing the format manager 184, a user is able to much more quickly create drawings or views that adhere to standards much more accurately. In using the format manager 184, the user only enters information that is associated with the drawing (e.g., a title). The format manager 184 is then able to collect and apply the attributes that should be included in all drawings following the standard (e.g., title location, size, and font).

Figure 8:
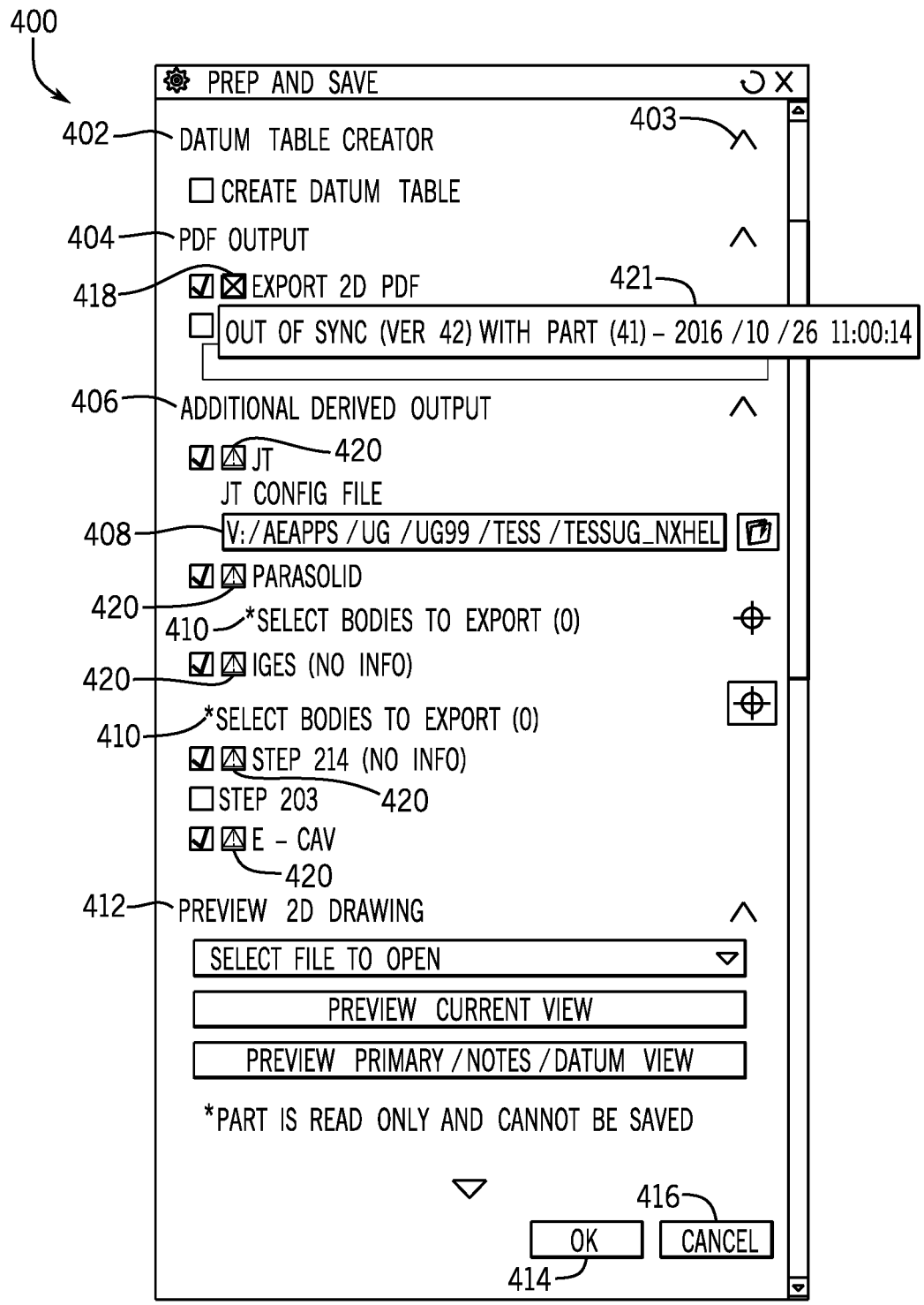
FIG. 8 is an embodiment of a GUI used to aid in generating various file formats of drawing of a model.

After utilizing the format manager 184, a user may utilize the conversion tool 185 to take further actions. For example, the format manager 184 may collect attributes and calculate settings needed to create a drawing and the conversion tool 185 may generate the formatted drawing 186. Further, the format manager 184 may generate views and the conversion tool 185 may convert the views into drawings. Further, the format manager 186 may generate formatted drawing 186, and the conversion tool 185 may allow further manipulation of the formatted drawing 186. FIG. 8 depicts an embodiment of a GUI 400, enabling the conversion, via the conversion tool 185, of the formatted drawing to various file types. The conversion tool 185 may maintain the attributes entered in the GUI 250 and shown in FIG. 7.

The GUI 400 may include various sections (e.g., a Datum Table Creator Section 402, a PDF Output Section 256, etc.) enabling categorization and/or conversion of formatting attributes and/or formatted drawings. One or more of the sections may include an arrow 403, which allows a user to hide or display the section in which the arrow 403 is displayed. This allows the user to make the GUI 400 more compact if the user desires. After attributes are input in the GUI 250 and/or the format manager 184 generates formatted drawings 186, a user may organize the attributes differently or convert the formatted drawings 186 to different file types.

In some instances, the attributes received in the GUI 250 may be recorded and stored in a data table. The Datum Table Creator Section 402 may allow a user to selectively generate a data table (e.g., an excel spreadsheet) that includes the attributes received from the GUI 250 (e.g., title, creation date, approved by, export classification, etc.). A user may choose to create the data table by selecting the selectable object next to the text "Create Datum Table." The generated data table may include all of the attributes received from the GUI 250, or a portion (e.g., 30 percent, 50 percent, 70 percent, or 90 percent) of the attributes received from the GUI 250. An example of a derived data table that may result from selecting an option to create a datum table in the Data Table Creator Section 402 is provided in FIG. 9, which will be discussed in more detail below.

In order to generate the data table, the conversion tool 185 may receive the attributes from the format manager 184. In some embodiments, the conversion tool 185 may receive the attributes before the format manager 184 generates the formatted drawing 186. The conversion tool 185 may then generate the data table based on the type of attribute and the input received by the GUI 250. The data table may allow a user to reference the attributes without viewing the formatted drawing 186.

Figures 9, 10:
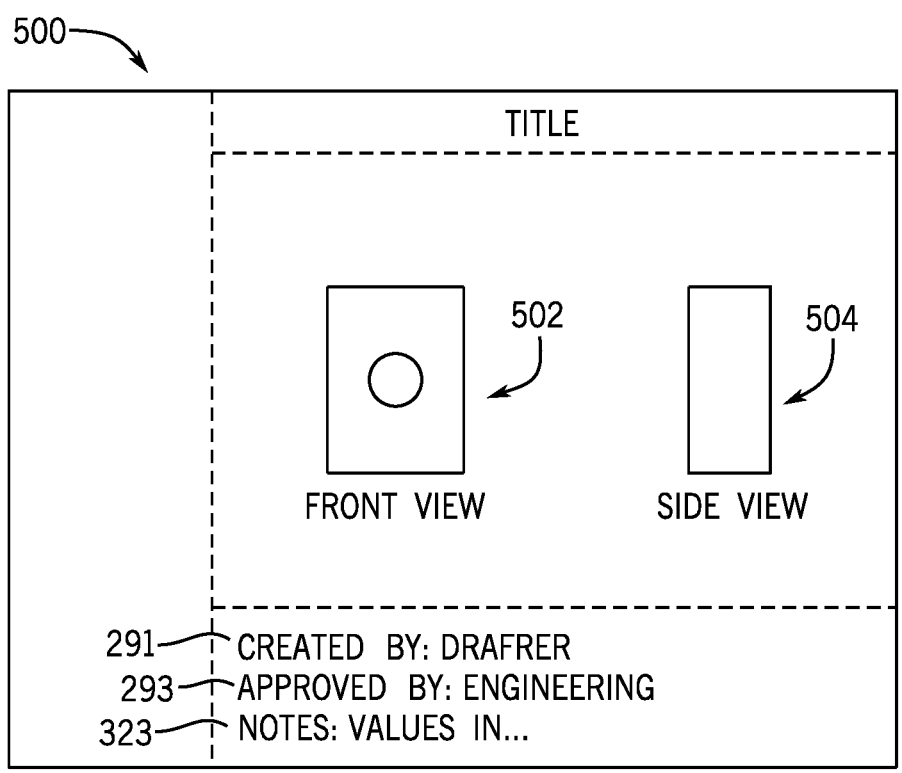
FIG. 9 is an embodiment of a data table generated by a conversion tool.
FIG. 10 is an embodiment of a 2D PDF of a model.

FIG. 9 depicts a portion of an embodiment of a data table 470 generated by the conversion tool 185. In the present embodiment, the data table 470 includes a type column 472 and a content column 474. The type column 472 indicates the type of information included in the row of the data table 470 and the content column 474 indicates what information was received by the format manager 184 in relation to the corresponding information in the type column 472. It should be appreciated that additional columns may be utilized to include additional information relating to the information included in the type column 472 and the content column 474.

Figure 11:
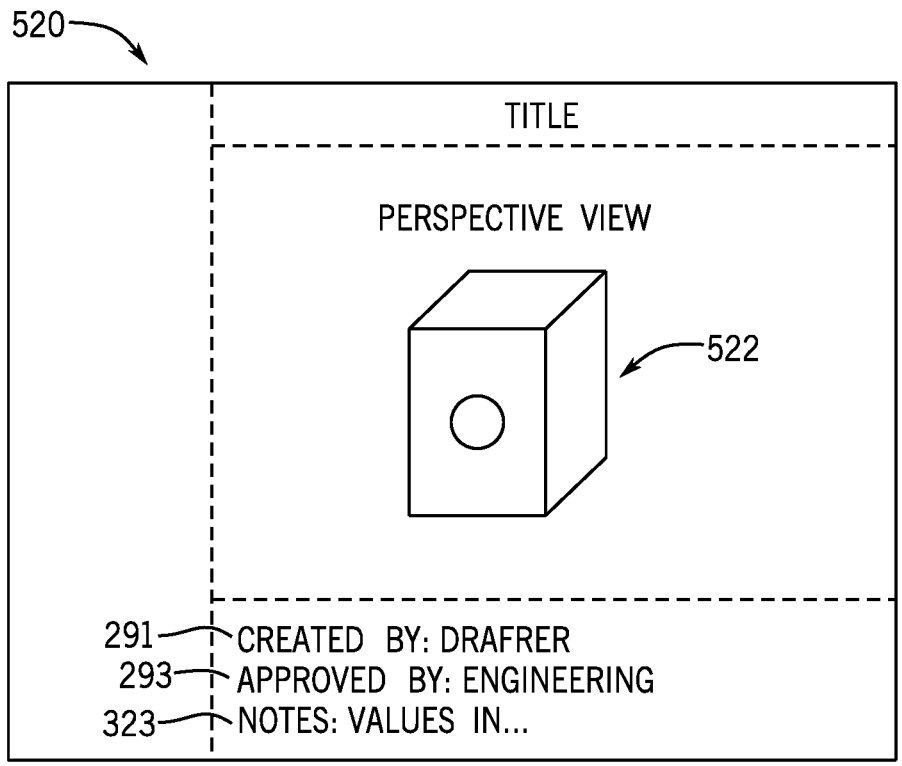
FIG. 11 is an embodiment of a 3D PDF of a model.

In some embodiments, it may be beneficial to convert the formatted drawing 186 to a different file type. For example, some programs may be able to open a limited number of file types, or some file types may use less processing power. The PDF Output Section 404 and an Additional Derived Output Section 406 may allow a user to convert the file type of the formatted drawing 186. The PDF Output Section 404 includes selectable objects that may allow a user to convert the formatted drawing 186 to a 2D PDF (e.g., as illustrated in FIG. 10 and discussed in more detail below) or a 3D PDF (e.g., as illustrated in FIG. 11 and discussed in more detail below). Converting the formatted drawing 186 to a 2D PDF or a 3D PDF may remove the ability to manipulate the model, and, in doing so, may reduce the file size and processing power used to load the file.

Further, in order to convert the formatted drawing 186 to a 2D PDF, the conversion tool 185 projects the portion of the 3D model used to create the formatted drawing 186 to a 2D plane. The 2D plane illustrates the same portions of the model that are depicted in the formatted drawing 186. In generating the 2D PDF, the conversion tool 185 uses the 2D plane of the model in place of the portion of the 3D model used in the formatted drawing 186. Thus, the view of the model in the 2D PDF file format remains the same as in the formatted drawing 186.

FIG. 10 depicts a 2D PDF drawing 500 of the same 3D model used to create the formatted drawing 186. In some embodiments, the conversion tool 185 may add or remove information to the drawing during a conversion. For example, the conversion tool 185 may include more or less attributes received by the format manager 184. As shown in FIG. 10, the 2D PDF drawing 500 includes the "Created By" option 290 input 291, the "Approved By" option 292 input 293, and the text box 321 input 323. Further, the conversion tool 185 may include more or less different views of the 3D model. For example, in the present embodiment, the 2D PDF drawing 500 includes a front view 502 of the 3D model and a side view 504 of the 3D model.

FIG. 11 depicts a 3D PDF drawing 520 of the same 3D model used to create the formatted drawing 186. In the present embodiment, the 3D PDF drawing 520 includes a perspective view 522 of the 3D model. Converting the formatted drawing 186 to the 3D PDF drawing 520 may preserve more features than a conversion to the 2D PDF drawing 500. For example, the 3D PDF drawing 520 may allow a user to rotate the 3D model, display shading of the 3D model, or display 3D model tree information.

Next, the Additional Derived Output Section 406 allows the user to selectively convert the formatted drawing 186 to different model file types. For example, the GUI 400 provides selectable objects that may allow the formatted drawing 186 to be converted to Jupiter Tessellation (JT), Parasolid, initial graphics exchange specification (IGES), standard for the exchange of product (STEP) 214, or STEP 203 file types. These file types may be executed by a broad range of CAD platforms, which may increase the accessibility to the formatted drawing 186. In order to convert the formatted drawing 186 to these file types, the conversion tool 185 may remove parametric data from the model, which may remove the ability to manipulate the model. This may reduce the size of the file and may use less processing power than the file type of the formatted drawing 186.

In the present embodiment, the selectable object for the JT file type includes an object 408 that allows a user to navigate a file explorer and select a JT configuration file. A JT configuration file may provide the level of detail of the model to be converted. For example, the JT configuration file may reduce the number of polygons used to form the model, remove part or assembly data, alter the tessellation, etc. The level of detail provided in the JT configuration file directly corresponds to the converted file size (i.e., a higher level of detail will create a larger file size compared to a lower level of detail).

In the present embodiment, the selectable objects for the Parasolid and IGES file types each include an object 410 that allows a user to select bodies (e.g., parts and/or assemblies) to export to the converted file type. By selecting the object 410, the user may select one or more parts and/or assemblies from the model to be included in the converted file. For example, a user may select a portion of the parts and/or assemblies included in the model. The object 410 may display the number of bodies that have been selected, and, in the illustrated embodiment, 0 bodies have been selected. Selecting more bodies generally increases the file size of the converted file.

A model may include information relating to instructions for inspecting the model. These model inspection instructions may be recorded during the drafting of the model, or may be recorded after the model is completed. The model inspection instructions may provide information relating to methods of inspection or parts that may be inspected more thoroughly than other parts. An electronic characteristic accountability and verification (E-CAV) file may include a compiled list of the recorded model inspection instructions. The Additional Derived Output Section 406 also includes selectable objects that allow a user to selectively compile the recorded inspection instruction to an E-CAV file.

In order to generate an E-CAV file, the conversion tool 185 receives the model information (e.g., from the formatted drawing 186 or from the CAD system 180). Then the conversion tool 185 searches for the recorded model instructions. If the conversion tool 185 finds recorded model instructions, the conversion tool 185 outputs a list (e.g., a text or excel file) of the recorded model instructions. For example, the recorded model instructions may include varied levels of inspection and product acceptance requirements. An example of an E-CAV file is provided in FIG. 12.

Figure 12:
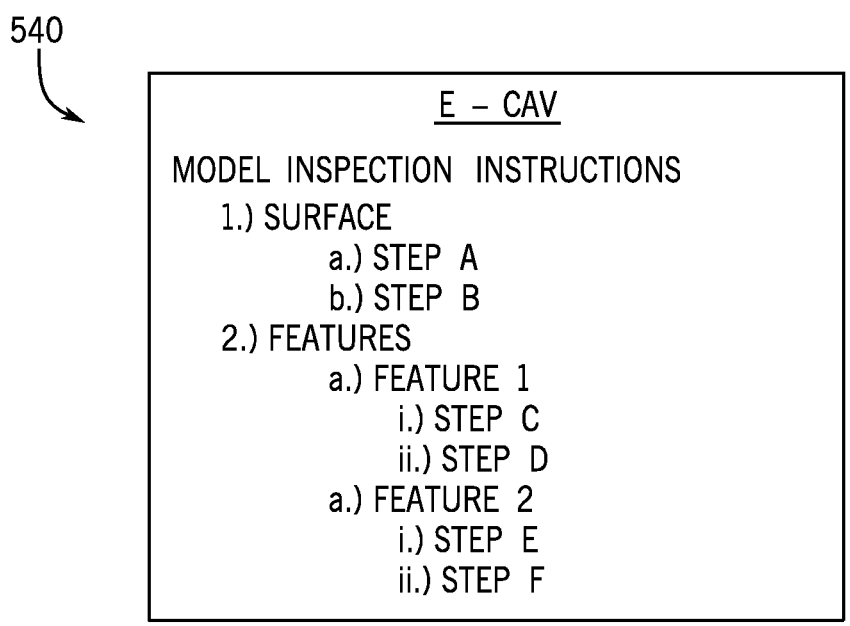
FIG. 12 is an embodiment of file that includes inspection instructions of a model.

FIG. 12 is an embodiment of an E-CAV file 540 including model inspection instructions. In the present embodiment, the E-CAV file 540 includes model inspection instructions; however, the E-CAV file 540 may include other information, as discussed above. As depicted, the model inspection instructions are displayed in a multi-level list format. Further, the model inspection instructions show instructions (i.e., Step A and Step B) for inspecting the surface of the model and instructions (i.e., Step C, Step D, Step E, and Step F) for inspecting Feature 1 and Feature 2 of the model. In another embodiment, the E-CAV file 540 may include an itemized list of inspection objects. Further, the list may include details relating to how an inspection should be performed.

The GUI 400 also includes a Preview 2D Drawing Section 412 that allows a user to view either a 2D PDF that has already been converted, or a 2D PDF that may be generated by the conversion tool 185. As discussed above, the 2D PDF file type project the 3D model to a 2D plane. This projection may alter the appearance of the model. A user may preview the 2D PDF before converting the file type to ensure the appearance remains unchanged. In the present embodiment, the Preview 2D Drawing Section 412 includes three selectable objects.

The first selectable object, labeled "Select File to Open," allows a user to select an already converted file. After selecting a converted file, the conversion tool 185 may display the 2D PDF (e.g., in a graphical user interface that presents a view of a 2D PDF such as the one depicted in FIG. 10). The second selectable object, labeled "Preview Current View," may cause the conversion tool 185 to display a 2D PDF of the view used in the selected formatted drawing 186 (e.g., in a graphical user interface that presents a view of a 2D PDF such as the one depicted in FIG. 10). The third selectable object, labeled "Preview Primary/Notes/Datum View," allows a user to select a view that is different from the one in the selected formatted drawing 186. For example, the formatted drawing 186 may include multiple drawing that each depict a different view (e.g., in a graphical user interface that presents a view of one or more of the outputs such as those depicted in FIGS. 10-13). The third selectable object allows a user to view 2D PDFs that depict the different views.

The GUI 400 allows includes an OK object 414 and a Cancel object 416. The OK object 414 allows a user to apply the selected objects and causes the conversion tool 185 to generate files in accordance with the selectable objects. In the present embodiment the OK object appears more transparent than the Cancel object 416. This, along with the message, labeled "*Part is read only and cannot be saved," indicates that the selected formatted drawing 186 and/or the model used in the formatted drawing 186 is in a "read only" mode (e.g., the file cannot be manipulated until the file is no longer in "read only" mode) and the conversion tool 185 cannot apply the selected objects. Further, the Cancel object 416 allows a user to cause the GUI 400 to close without applying the selected objects.

Prior to generation of the outputs, model changes may result in errors and/or features of the resultant outputs potentially becoming outdated. The GUI 400 may display an error indication 418 or a warning indication 420 to indicate whether a model is or may be out-of-date. For example, the error indication 418 illustrates that a resultant 2D PDF export includes errors. Further, the warning indications 420 in FIG. 8 illustrate that the associated outputs (e.g., JT, Parasolid, IGES, STEP 214, and E-CAV outputs) may be outdated. Further, an error annotation 421 (e.g., triggered by a hover-over on a feature corresponding to the error indication 418) may provide a particular error. For example, in FIG. 8, the error annotation 421 indicates that there is mismatch in synchronization of a part (e.g., part 41).

Figure 13:
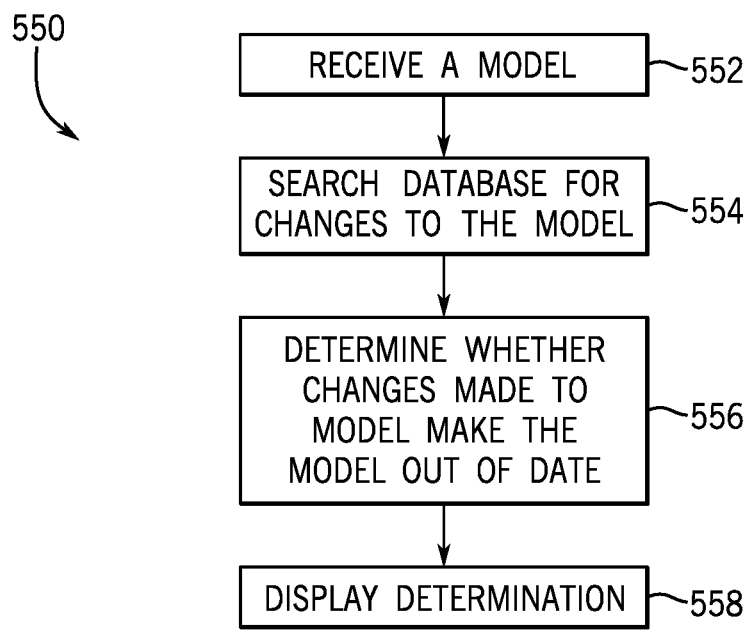
FIG. 13 is a flowchart illustrating an embodiment of a process to determine whether a model has been updated.

FIG. 13 is a flow chart illustrating an embodiment of a process 550 to determine whether a model is up-to-date. Although the following process 550 describes a number of operations that may be performed, it should be noted that the process 550 may be performed in a variety of suitable manners, using some or all of the operations of the process 550.

The process 550 receives (block 552) a model (e.g., from the formatted drawing 186 or the database 182) and a part number associated with the model. Then, the process 550 searches (block 554) the database 182 for changes made to the model. The process 550 may complete the search by comparing the features of the model received in block 552 to the features of the most recent model associated with the part number.

The process 550 determines (block 556) whether the changes made to the model put the model in a condition that is considered out-of-date. In order to make this determination, the process 550 may organize the changes made into a hierarchy of importance that may include three levels of importance. Certain changes to the model (e.g., changes to the shapes or sizes of features) may be in a higher level of importance than other changes to the model (e.g., changing the name of a part). Changes made that fall into a first level of importance may cause the process 550 to determine (block 556) that the model is up-to-date. Changes made that fall into a second level of importance may cause the process 550 to determine (block 556) that the model may be out-of-date (i.e., it is unclear whether the model is up-to-date or out-of-date). Changes made that fall into a third level of importance may cause the process 550 to determine (block 556) that the model is out-of-date.

Depending on the determination made in block 556, the process may display an indication (e.g., the error indication 418 or the warning indication 420) on the GUI 400. If the changes fall into the first level, the process will not display a determination. If the changes fall into the second level, the process 550 displays (block 558) the warning indication 420 in the GUI 400 next to the available file types. If the changes fall into the third level, the process 550 displays (block 558) the error indication 418 in the GUI 400 next to the available file types. Further, the error indication 418 and the warning indication 420 may include text (e.g., error annotation 421) that provides details that indicate the reason the indication is present. For example, in the present embodiment, the error indication 418 includes text that indicates that the model is out of sync, which version of the model includes the change, which part has been changed, and the date on which the change was made.

In the present embodiment, both the error indication 418 and the warning indication 420 are displayed in the GUI 400 for illustrative purposes. The indication displayed may be different for different file types. For example, as discussed above, a portion of the model may be selected for certain file types. In some embodiments, the changes made may not affect the selected portion of the model, but may affect the non-selected portion of the model. In this embodiment, the indication displayed next to the file types may be different for different file types.

This written description uses examples for the present disclosure, including the best mode, and also to enable any person skilled in the art to practice the present disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A tangible, non-transitory, machine-readable medium, comprising machine-readable instructions to:

present a graphical user interface (GUI), wherein the GUI provides an affordance for concurrent selection of two or more output file types, wherein the affordance comprises a plurality of selectable objects, each of the plurality of selectable objects associated with a corresponding output file type;

accessing an applicable computer-aided-design (CAD) model;

search a database for a last-saved version of the CAD model; wherein the database is configured to store the CAD model and a plurality of versions of the CAD model; wherein the last-saved version of the CAD model is one of the plurality of versions of the CAD model;

compare the CAD model and the last-saved version of the CAD model;

determine whether the CAD model is out-of-date, may be out-of-date, or up-to-date based on differences between the comparison of the CAD model and the last-saved version of the CAD model, by categorizing each of a plurality of differences between the CAD model and the last-saved version of the CAD model into a first level, a second level, and a third level based on the type of each of the plurality of differences, wherein the first level, the second level, and the third level indicate relative levels of importance of differences; and display an indication on the GUI that indicates the CAD model may be out-of-date if at least one of the plurality of differences is categorized into the second level and none of the plurality of differences is categorized into the third level;

receive an indication of the concurrent selection of at least two of the two or more output file types, wherein the concurrent selection comprises selection of selectable objects associated with the at least two of the two or more output file types prior to triggering generation of output files of the at least two of the two or more output file types;

generate corresponding output files for the concurrent selection of the at least two of the two or more output file types, by:
  accessing one or more attributes associated with the CAD model;
  deriving applicable data that is applicable to the at least two of the two or more output file types from the CAD model and from the one or more attributes; and
  generating an output file for each of the at least two of the two or more output file types, wherein the output file is formatted in accordance with the applicable data applied to a formatting specification of a corresponding output file type.

2. The machine-readable medium of claim 1, comprising machine-readable instructions to:
  generate a datum table, comprising the one or more attributes; wherein one of the at least two of the two or more output file types comprises a datum table output file type.

3. The machine-readable medium of claim 1, comprising machine-readable instructions to:
  generate a two-dimensional (2D) portable document format file, comprising the CAD model; wherein one of the at least two of the two or more output file types comprises a 2D portable document format file type.

4. The machine-readable medium of claim 3, comprising machine-readable instructions to:
  project a portion of the CAD model comprising a three-dimensional model onto a 2D plane; wherein the portion of the CAD model is the portion shown in at least one drawing comprising the CAD model.

5. The machine-readable medium of claim 3, wherein the plurality of selectable objects comprise checkboxes.

6. The machine-readable medium of claim 1, comprising machine-readable instructions to:
generate a second CAD model, comprising a fewer number of manipulable features than the CAD model; wherein one of the at least two of the two or more output file types comprises at least one of a three-dimensional portable document format file type, a Jupiter Tessellation file type, a Parasolid file type, an initial graphics exchange specification file type, a standard for the exchange of product 214 file type, or a standard for the exchange of product 203 file type.

7. The machine-readable medium of claim 1, comprising machine-readable instructions to:
display an indication on the GUI that indicates the CAD model is out-of-date if at least one of the plurality of differences is categorized into a third level.

8. The machine-readable medium of claim 1, comprising machine-readable instructions to:
determine if a permission to save or create files is received;
prevent generation of the output file is the permission is not received.

9. A computer system, comprising a processor, configured to:
accessing an applicable computer-aided-design (CAD) model;
present a graphical user interface (GUI), wherein the GUI provides an affordance for requesting multi-file-type generation of two or more output file types, wherein the affordance comprises a plurality of selectable objects, each of the plurality of selectable objects associated with a corresponding output file type;
search a database for a last-saved version of the CAD model; wherein the database is configured to store the CAD model and a plurality of versions of the CAD model; wherein the last-saved version of the CAD model is one of the plurality of versions of the CAD model;
compare the CAD model and the last-saved version of the CAD model;
categorize each of a plurality of differences between the CAD model and the last-saved version of the CAD model into a first level, a second level, and a third level based on the type of each of the plurality of differences, wherein the first level, the second level, and the third level indicate relative levels of importance of differences;
determine whether the CAD model is out-of-date, may be out-of-date, or up-to-date based on the differences between the CAD model and the last-saved version of the CAD model;
display an indication on the GUI that indicates the CAD model is out-of-date if at least one of the plurality of differences is categorized into the third level, wherein the third level comprises a relatively higher importance than the first level and the second level, or display an indication on the GUI that indicates the CAD model may be out-of-date if at least one of the plurality of differences is categorized into the second level and none of the plurality of differences is categorized into the third level;
receive, via the affordance, an indication of a concurrent selection of at least two of the two or more output file types, wherein the concurrent selection comprises selection of selectable objects associated with the at least two of the two or more output file types prior to triggering generation of output files of the at least two of the two or more output file types;
in response to receiving the indication, trigger the multi-file-type generation, by generating corresponding output files for the selection of the at least two of the two or more output file types, by:
accessing one or more attributes associated with the CAD model;
deriving applicable data that is applicable to the at least two of the two or more output file types from the CAD model and from the one or more attributes; and
generating an output file for each of the at least two of the two or more output file types, wherein the output file is formatted in accordance with the applicable data applied to a formatting specification of a corresponding output file type.

10. The computer system of claim 9, comprising a processor, configured to:
generate a second CAD model, comprising a fewer number of manipulable features than the CAD model; wherein one of the at least two of the two or more output file types comprises at least one of a three-dimensional portable document format file type, a Jupiter Tessellation file type, a Parasolid file type, an initial graphics exchange specification file type, a standard for the exchange of product 214 file type, or a standard for the exchange of product 203 file type.

11. The computer system of claim 9, comprising a processor, configured to:
determine if a permission to save or create files is received;
prevent generation of the output file is the permission is not received.

12. A computer-implemented method, comprising:
accessing an applicable computer-aided-design (CAD) model;
presenting a graphical user interface (GUI), wherein the GUI provides an affordance for concurrent selection of two or more output file types, wherein the affordance comprises a plurality of selectable objects, each of the plurality of selectable objects associated with a corresponding output file type;
searching a database for a last-saved version of the CAD model; wherein the database is configured to store the CAD model and a plurality of versions of the CAD model; wherein the last-saved version of the CAD model is one of the plurality of versions of the CAD model;
comparing the CAD model and the last-saved version of the CAD model;
categorizing each of a plurality of differences between the CAD model and the last-saved version of the CAD model into a first level, a second level, and a third level based on the type of each of the plurality of differences, wherein the first level, the second level, and the third level indicate relative levels of importance of differences;
determining whether the CAD model is out-of-date, may be out-of-date, or up-to-date based on the differences between the CAD model and the last-saved version of the CAD model;
displaying an indication on the GUI that indicates the CAD model is out-of-date if at least one of the plurality of differences is categorized into the third level, wherein the third level comprises a relatively higher importance than the first level and the second level, or display an indication on the GUI that indicates the CAD model may be out-of-date if at least one of the plurality of differences is categorized into the second level and none of the plurality of differences is categorized into the third level;

receiving an indication of the concurrent selection of at least two of the two or more output file types, wherein the concurrent selection comprises selection of selectable objects associated with the at least two of the two or more output file types prior to triggering generation of output files of the at least two of the two or more output file types;

generating corresponding output files for the concurrent selection of the at least two of the two or more output file types, by:
 accessing one or more attributes associated with the CAD model;
 deriving applicable data that is applicable to the at least two of the two or more output file types from the CAD model and from the one or more attributes; and
 generating an output file for each of the at least two of the two or more output file types, wherein the output file is formatted in accordance with the applicable data applied to a formatting specification of a corresponding output file type.

13. The method of claim 12, comprising:
generating a two-dimensional (2D) portable document format file, comprising the CAD model; wherein one of the at least two of the two or more output file types comprises a 2D portable document format file type.

14. The method of claim 13, comprising:
projecting a portion of the CAD model comprising a three-dimensional model onto a 2D plane; wherein the portion of the CAD model is the portion shown in at least one drawing comprising the CAD model.

15. The method of claim 13 comprising:
generating a preview of the 2D portable document format file before generating the 2D portable document format file; wherein the preview comprises an image of the 2D portable document format file.

* * * * *